US009865488B2

(12) United States Patent
Itakura

(10) Patent No.: US 9,865,488 B2
(45) Date of Patent: Jan. 9, 2018

(54) PROCESSING METHOD AND PROCESSING APPARATUS

(71) Applicant: Tokyo Electron Limited, Tokyo (JP)

(72) Inventor: Akira Itakura, Miyagi (JP)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 14/432,774

(22) PCT Filed: Oct. 31, 2013

(86) PCT No.: PCT/JP2013/079625
§ 371 (c)(1),
(2) Date: Apr. 1, 2015

(87) PCT Pub. No.: WO2014/073457
PCT Pub. Date: May 15, 2014

(65) Prior Publication Data
US 2015/0235886 A1 Aug. 20, 2015

Related U.S. Application Data

(60) Provisional application No. 61/727,199, filed on Nov. 16, 2012.

(30) Foreign Application Priority Data

Nov. 7, 2012 (JP) .................. 2012-245821

(51) Int. Cl.
H01L 21/677 (2006.01)
B25J 11/00 (2006.01)

(52) U.S. Cl.
CPC ..... *H01L 21/67745* (2013.01); *B25J 11/0095* (2013.01); *H01L 21/67769* (2013.01); *H01L 21/67778* (2013.01)

(58) Field of Classification Search
CPC ......... H01L 21/67745; H01L 21/67769; H01L 21/67778; B25J 11/0095
See application file for complete search history.

(56) References Cited

U.S. PATENT DOCUMENTS 5,390,785 A * 2/1995 Garric et al. ............... 206/213.1
5,411,358 A * 5/1995 Garric et al. ................. 414/277
(Continued)

FOREIGN PATENT DOCUMENTS

JP 2006-278396 10/2006

Primary Examiner — Seahvosh Nikmanesh
(74) Attorney, Agent, or Firm — IPUSA, PLLC

(57) ABSTRACT

A method of processing an object to by using a processing apparatus is provided. The apparatus includes a plurality of containers to contain the object, a plurality of process chambers to perform a desired process on the object, a temporary storage chamber to temporarily store the object, and a transfer device to transfer the object. The method includes a first step of transferring an unprocessed object from the containers to the process chambers, and a second step of transferring a processed object from the process chambers to the temporary storage chamber. The method further includes a third step of collecting the processed object into one of the containers starting a collection of the processed object from the temporary storage chamber depending on a timing of processing a last object of the one of the containers prior to collecting the processed object into the other containers from the temporary storage chamber.

6 Claims, 7 Drawing Sheets

(56) References Cited

U.S. PATENT DOCUMENTS

| | | | |
|---|---|---|---|
| 6,134,482 A * | 10/2000 | Iwasaki | G05B 19/41865 414/14 |
| 6,157,866 A * | 12/2000 | Conboy et al. | 700/121 |
| 2001/0051837 A1* | 12/2001 | Tateyama et al. | 700/112 |
| 2003/0077150 A1* | 4/2003 | Matsuda et al. | 414/217 |

* cited by examiner

FIG.3

| TRANSFER ORDER | WAFER NO. | TRANSFER ROUTE | | |
|---|---|---|---|---|
| | | TEMPORARILY STORING IN ST | | CARRYING OUT WHEN LAST UNPROCESSED WAFER CARRIED IN PM |
| 1 | 101 | LP1—PM1—STA | ·········· | STA-LP1 |
| 2 | 201 | LP2—PM2—STB | ·········· | STB-LP2 |
| 3 | 301 | LP3—PM3—STC | ·········· | STC-LP3 |
| 4 | 401 | LP4—PM4—STD | ·········· | STD-LP4 |
| 5 | 102 | LP1—PM1—STA | ·········· | STA-LP1 |
| 6 | 202 | LP2—PM2—STB | ·········· | STB-LP2 |
| 7 | 302 | LP3—PM3—STC | ·········· | STC-LP3 |
| 8 | 402 | LP4—PM4—STD | ·········· | STD-LP4 |
| 9 | 103 | LP1—PM1—STA | ·········· | STA-LP1 |

PROCESSING METHOD AND PROCESSING APPARATUS

TECHNICAL FIELD

The present invention relates to a processing method and a processing apparatus.

BACKGROUND ART

In manufacturing semiconductor devices or FPDs (Flat Panel Displays), various processes such as a film deposition, an etching, an oxidizing, a diffusing and the like are performed on a semiconductor wafer (which is hereinafter called just a "wafer") or a substrate for a liquid crystal display that is an object to be processed. In recent years, a substrate processing apparatus called a multi chamber system is used in order to perform these processes with a high throughput.

An apparatus of a cluster type is proposed including a plurality of load ports capable of receiving a FOUP (container) for containing wafers, a plurality of process modules, a storage for temporarily storing processed wafers, and a transfer device for transferring the wafers (for example, see Patent Document 1).

This substrate processing apparatus transfers the wafer to the FOUP placed on the load port, the process module, the storage, and the FOUP placed in the load port in this order. In the process module, a desired process such as an etching process or the like is performed on the wafer. For example, in such a process, remaining gases such as a CF-based gas, HBr gas and the like adsorb on a surface of the wafer after being etched by plasma using the CH-based gas and HBr gas as etching gases. The remaining gases such as the CF-based gas, HBr gas and the like adsorbing on the surface of the wafer react with water in the air when the wafer is carried out of the process module in this state. As a result, a corrosive gas is generated. The corrosive gas is liable to adsorb on the wafer and to corrode the wafer and its surroundings. In particular, the corrosive gas sometimes occurs from the processed wafer because the FOUP loaded in the load port is filled with the air.

Therefore, the wafers are temporarily stored in a temporary storage chamber called a storage before collecting the wafers in the FOUP loaded in the load port. In the storage, the wafers and an atmosphere around the wafers are purged by a gas such as $N_2$ gas or the like. This causes the corrosive gas to be removed from the inside of the storage and prevents the inside and periphery of the FOUP from being contaminated by the corrosive gas when the wafers are collected into the FOUP loaded in the load port.

PRIOR ART DOCUMENTS

Patent Documents

Patent Document 1: Japanese Laid-Open Patent Application Publication No. 2006-278396

SUMMARY OF THE INVENTION

Problem to be Solved by the Invention

However, when the processed wafer is collected into the FOUP in which an unprocessed wafer remains, the unprocessed wafer is sometimes contaminated by the corrosive gas that has not been fully removed from the inside of the storage.

Therefore, control of preventing the unprocessed wafer and the processed wafer from being placed together in the same FOUP is performed by starting an operation of collecting the processed wafers from the storage at a predetermined timing after the last unprocessed wafer is carried out of the FOUP loaded on the load port.

For example, a case is considered in which four FOUPs are placed on four load ports LP1 through LP4, respectively, for describing a method of collecting the wafers in the FOUPs loaded on the load ports. Carrying unprocessed wafers out of the FOUPs loaded on the load ports LP1 through LP4 starts at approximately the same time. Hence, in general, collecting the processed wafers in the FOUPs loaded on the load ports LP1 through LP4 starts at the same time. More specifically, collecting the processed wafers from the storage into the FOUPs loaded on the load ports LP1 through LP4 is performed in the order of the collection of the first wafer into the FOUP loaded on the load port LP1, the collection of the second wafer into the FOUP loaded on the load port LP2, the collection of the third wafer into the FOUP loaded on the load port LP3, the collection of the fourth wafer into the FOUP loaded on the load port LP4, the collection of the fifth wafer into the FOUP loaded on the load port LP1, and the collection of the sixth wafer into the FOUP loaded on the load port LP2.

In the above method of collecting the wafers into the FOUPs loaded on the load ports, because the wafers are collected into the load ports LP1 through LP4 in parallel, any of the collection of the wafers into the FOUPs loaded on the load ports LP1 through LP4 does not complete until all of the wafers are collected into the FOUPs loaded on the load ports LP1 through LP4. Due to this, it takes a long time after starting the collection of the wafers until carrying the FOUPs out, which delays the process for the next lot. This causes the throughput to decrease and goes into an idle state because the process module is not used for a long time. During this period of time, because the conditions in the process module change, a dummy process is needed to properly adjust the conditions of the process module before processing a new wafer, which further reduces the productivity.

In response to the above matters, one embodiment of the present invention aims to provide a processing method and a processing apparatus that can improve a throughput by properly adjusting a method of collecting a processed object.

Means for Solving the Problem

According to an embodiment of the present invention, there is provided a method of processing an object to be processed by using a processing apparatus. The processing apparatus includes a plurality of containers to contain the object, a plurality of process chambers configured to perform a desired process on the object therein, a temporary storage chamber to temporarily store the object therein, and a transfer device configured to transfer the object. The method includes a first step of transferring an unprocessed object from the plurality of containers to the plurality of process chambers, and a second step of transferring a processed object from the plurality of process chambers to the temporary storage chamber. The method further includes a third step of collecting the processed object into one of the plurality of containers starting a collection of the processed object from the temporary storage chamber in response to a timing of processing a last object of the one of the plurality of containers prior to collecting the processed object into the other containers from the temporary storage chamber and finishing the collection of the processed object into the one of the plurality of containers.

According to another embodiment of the present invention, there is provided a processing apparatus that includes a plurality of containers to contain an object to be processed, a plurality of process chambers configured to perform a desired process on the object thereinside, a temporary storage chamber to temporarily store the object, and a transfer device configured to transfer the object. The apparatus further includes a control unit configured to control the plurality of containers, the plurality of process chambers and the transfer device. The control unit controls the containers, the process chambers and the transfer device so as to transfer an unprocessed object from the plurality of containers to the plurality of process chambers, to transfer a processed object from the plurality of process chamber to the plurality of temporary storage chamber, to collect the processed object into one of the plurality of containers starting a collection of the processed object from the temporary storage chamber in response to a timing of processing a last object of the one of the plurality of containers prior to collecting the processed object into the other containers from the temporary storage chamber and to finish the collection of the processed object into the one of the plurality of containers.

Advantageous Effect of the Invention

According to an embodiment of the present invention, a throughput can be improved by properly adjusting a method of collecting a processed object.

BRIEF DESCRIPTION OF THE DRAWINGS

FIG. 3 is an explanation drawing of the transfer route using the processing apparatus according to an embodiment;

EMBODIMENTS FOR IMPLEMENTING THE INVENTION

Figure 1:
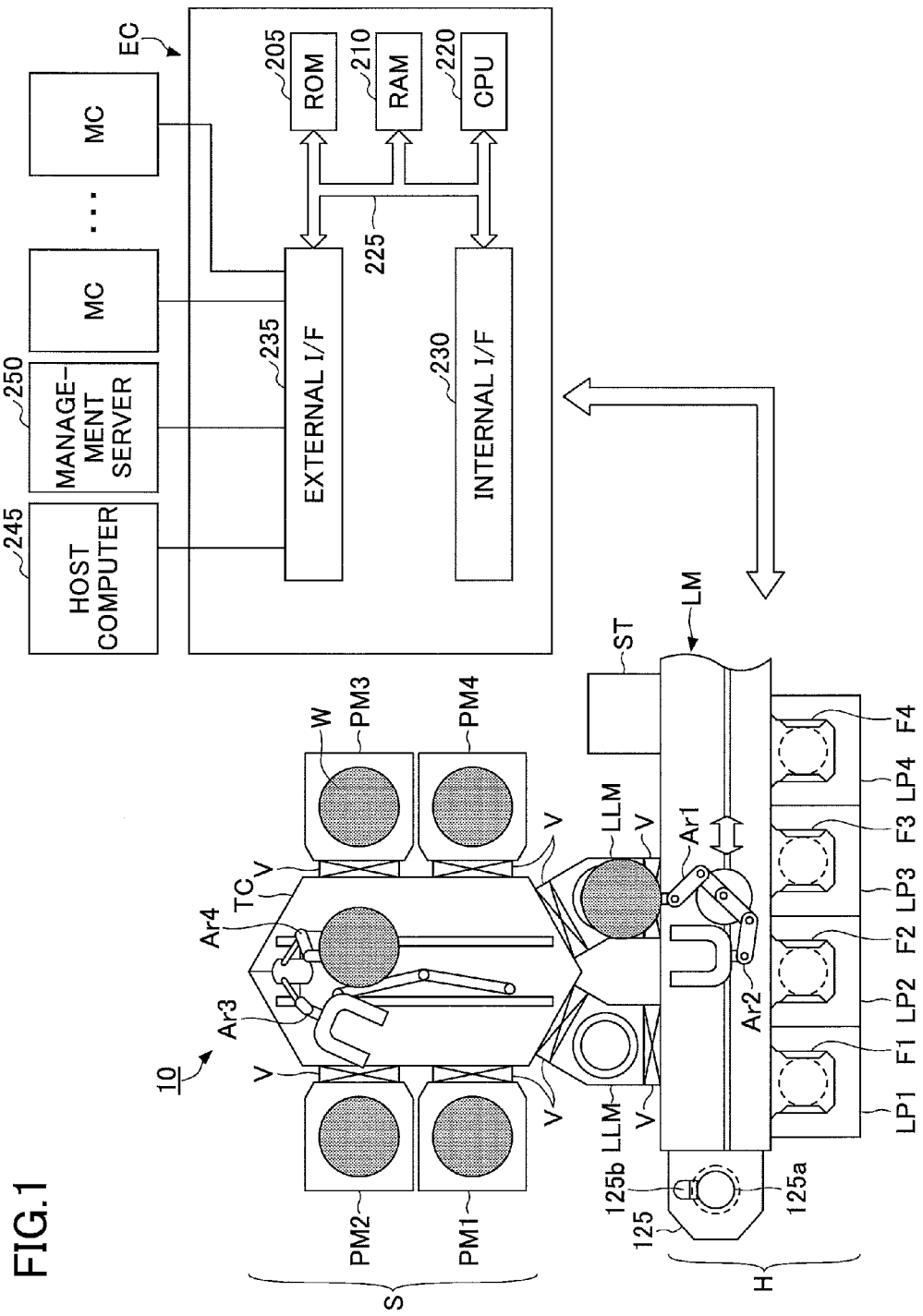
FIG. 1 is an overall configuration diagram of a processing apparatus according to an embodiment.

In the following, embodiments of the present invention are described with reference to the accompanying drawings. The present invention is not limited to the following embodiments, and various modifications and alternatives can be added to the following embodiments without departing from the scope of the present invention. Note that elements having substantially the same functions or features may be given the same reference numerals and overlapping descriptions thereof may be omitted.

[Overall Configuration of Processing Apparatus]

To begin with, a description is given below of an overall configuration of a processing apparatus of an embodiment of the present invention with reference to FIG. 1. FIG. 1 is an overall configuration diagram of the processing apparatus of the embodiment. The processing apparatus 10 includes a transfer-side system H for transferring a wafer W and a process-side system S for performing a process on the wafer W such as a film deposition process or an etching process. The transfer-side system H and the process-side system S are coupled to each other through two load lock modules LLM. Although two of the load lock modules LLM are provided in the embodiment, three or more of the load lock modules LLM may be installed without being limited to this embodiment.

The transfer-side system H includes load ports LP1 through LP4 (which may be hereinafter collectively called a load port LP or load ports LP) and a load module LM. Four FOUPs F1 through F4 (which may be hereinafter collectively called a FOUP F or FOUPs F) are placed on the load ports LP1 through LP4, respectively. The FOUPs F1 through F4 are containers to accommodate a plurality of wafers W. For example, the FOUP can accommodate 25 unprocessed wafers W on multiple supports.

The load module LM supports two bendable, stretchable and rotatable transfer arms Ar1 and Ar2 so as to move by sliding by magnetic drive. The transfer arms Ar1 and Ar2 hold the wafer W on a fork attached to a tip thereof, and slides on a rail on the load module LM.

An alignment mechanism 125 is attached to the load module LM. The unprocessed wafers W are carried out of the FOUPs F1 through F4 placed on the load ports LP1 through LP4, transferred while being held by either the transfer arm Ar1 or Ar2, and placed on a rotatable pedestal 125a of the alignment mechanism 125. The rotatable pedestal 125a rotates in a state of supporting the wafer W thereon, and adjusts a position of the wafer W by causing an optical sensor to detect a state of a periphery of the wafer W.

Gate valves V are provided at both ends of two of the load lock modules LLM. After the alignment, the wafer W is transferred to either of two of the load lock modules LLM by way of the load module LM. The load lock modules LLM transfer the wafer W between an atmosphere side (transfer-side system H) and a vacuum side (process-side system S) by controlling the open and close of the gate valves V.

A transfer chamber TC and four process modules PM1 through PM4 (which may be hereinafter collectively called a process module PM or process modules PM) are provided in the process-side system S. The process modules PM1 through PM4 are an example of a plurality of process chambers for performing a desired process on the wafer W therein. Although four of the process chambers are provided in the embodiment, for example, six of the process chambers may be provided as long as a plurality of process chambers is provided, without being limited to this embodiment.

The transfer chamber TC is coupled to the process modules PM1 through PM4 through the gate valves V. The transfer chamber TC includes bendable, stretchable and rotatable transfer arms Ar3 and Ar4. The wafer W is transferred to the process modules PM1 through PM4 while being held by the transfer arms Ar3 and Ar4. The transfer chamber TC and the load module LM are an example of a transfer device for transferring the wafer W.

The wafer W is sequentially transferred to the FOUP loaded on the load port LP, the load module LM, the load lock module LLM, the transfer chamber TC, the process module PM, the transfer chamber TC, the load lock module LLM, the load module LM and a storage ST by using the transfer arms Ar3 and Ar4 and the transfer arms Ar1 and Ar2. The storage ST is attached to the load module LM (atmosphere side). The storage ST is an example of a temporary storage chamber for temporarily storing the wafer W. The storage ST may purge processed wafers W by $N_2$ gas by supplying $N_2$ gas to the inside thereof, or may hold the processed wafers W without purging the processed wafers W for a certain period of time. This enables a corrosive gas adsorbing on the processed wafers W to be removed inside the storage ST.

[Apparatus Computer]

A description is given below of a configuration of an apparatus computer EC and the like. The apparatus computer EC is connected to a plurality of machine computers, and controls the plurality of machine computers MC and an operation of the entire processing apparatus 10. The apparatus computer EC functions as a master control unit, and the machine computers MC function as slave control units. The apparatus computer EC instructs each of the machine computers MC to control each part of the processing apparatus 10.

The apparatus computer EC is an example of a control unit configured to control the processing apparatus 10. The apparatus computer EC and the machine computers MC, including control functions of the plurality of machine computers MC, may constitute a control unit for controlling the processing apparatus 10.

The apparatus computer EC includes a ROM (Read Only Memory) 205, a RAM (Random Access Memory) 210, a CPU (Central Processing Unit) 220, a bus 225, an internal interface (internal I/F) 230, and an external interface (external I/F) 235. The ROM 205 and the RAM 210 store a program for controlling the transfer of the wafers W and the process, various recipes, and various data. The ROM 205 and the RAM 210 are examples of a memory unit, and may be a memory unit such as an EEPROM, an optical disk, a magnetic optical disk and the like. The CPU 220 controls the transfer and the process of a specified wafer W in accordance with the recipe stored in the ROM 205 or the RAM 210. For example, the CPU 220 controls a transfer order of the plurality of wafers W, a transfer route, a transfer timing and the like. The bus 225 is a path for transferring data among devices of the ROM 205, the RAM 210, the CPU 220, the internal interface 230, and the external interface 235. The internal interface 230 is an interface for operating each part of the processing apparatus 10. The external interface 235 is an interface for sending and receiving data among a host computer 245, the management server 250 and the plurality of machine controllers MC.

The apparatus computer EC is connected to the host computer 245 that functions as an MES (Manufacturing Execution Systems) for controlling a manufacturing process of a whole factory in which the processing apparatus 10 is installed by way of a LAN (Local Area Network). The host computer 245 sends real time information concerning the process in the factory to the management server 250 by cooperating with the apparatus computer EC. Here, the functions of the apparatus computer EC and the machine computers MC may be implemented by either software or hardware.

The overall configuration of the processing apparatus 10 according to the embodiment has been described hereinabove. Next, a description is given below of the transfer of the wafers W in the embodiment with reference to FIGS. 2 and 3.

[Transfer of Wafers]

Figure 2:
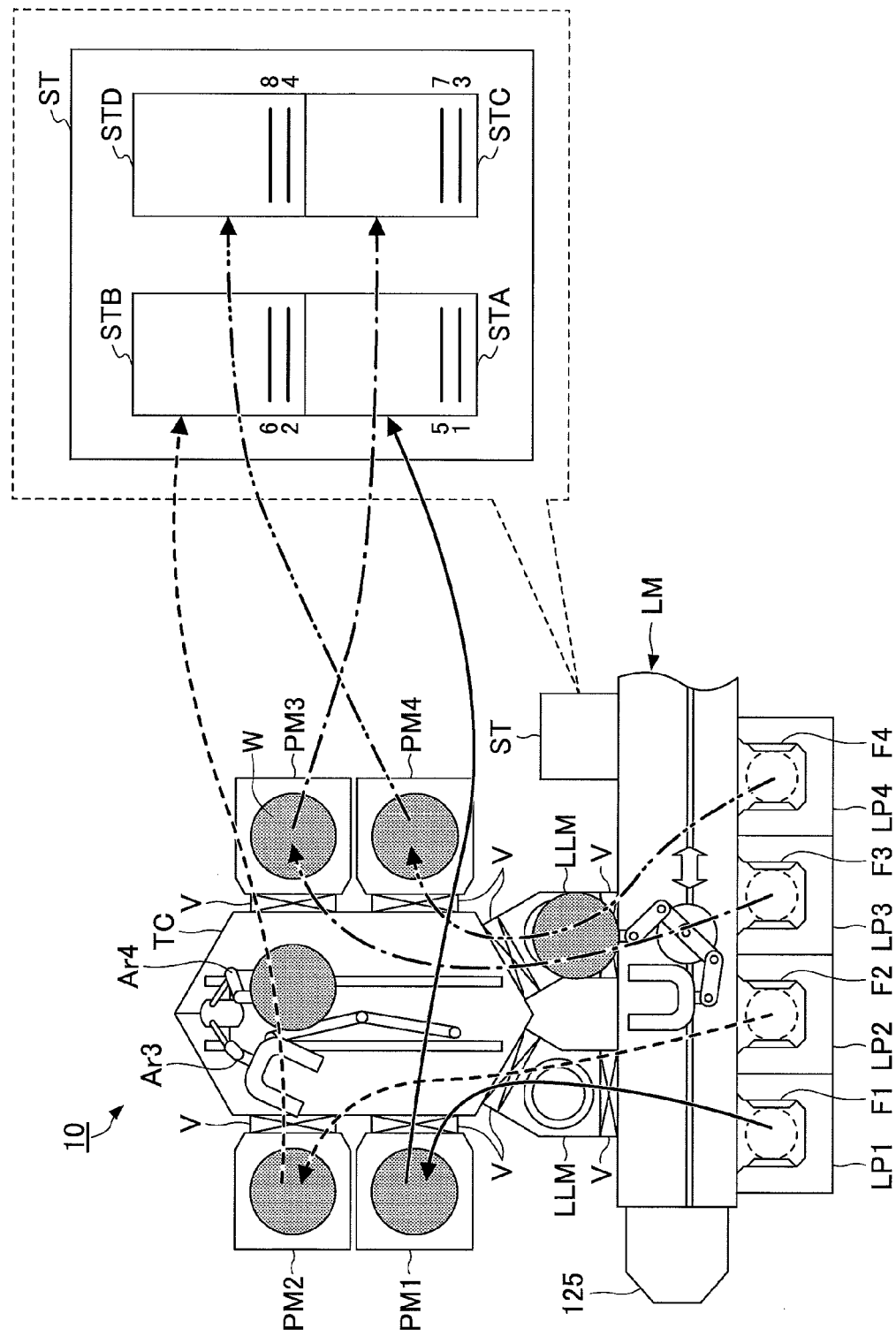
FIG. 2 is a diagram illustrating an example of a transfer route using the processing apparatus according to an embodiment.

FIG. 2 illustrates an example of transfer routes from the FOUPs F placed on the load ports LP1 through LP4 to the storage ST in the processing apparatus 10 according to an embodiment. FIG. 3 is a diagram to explain the transfer routes in the processing apparatus 10 according to the embodiment. In the following description, the FOUPs F are assumed to be already placed on the load ports LP, and an expression of "carrying a wafer W out of the load port LP" means carrying the wafer W out of the FOUP F loaded on the load port LP. Similarly, an expression of "collecting a wafer W into the load port LP" means collecting the wafer W into the FOUP F loaded on the load port LP.

In the embodiment, the wafer W is transferred in a state of corresponding four of the load ports LP1 through LP4 one-to-one with four of the process modules PM1 through PM4, respectively. The inside of the storage ST is divided into four blocks STA, STB, STC and STD, and the wafer W is transferred in a state of corresponding four of the process modules PM1 through PM4 one-to-one with four of the blocks STA, STB, STC and STD. Accordingly, all of the wafers W carried out of the load port LP1 are transferred to the process module PM1, subject to a desired process in the process module PM1, and temporarily stored in the box STA of the storage ST. Hence, the wafer W carried out of the load port LP1 is transferred to none of the other process module PM2 through PM4, the other boxes STB, STC and STC of the storage ST, and the other load ports LP2 through LP4. Similarly, the wafers W carried out of the load ports LP2, LP3 and LP4 are transferred to the process modules PM2, PM3 and PM4, respectively, and temporarily stored in the boxes STB, STC and STD, respectively, after being subject to desired processes, respectively. Hereinabove, the description has been given of an example of a first process of transferring the unprocessed wafers W from the plurality of load ports LP to the plurality of process modules PM, and an example of a second process of transferring the processed wafers W from the plurality of process modules PM to the storage ST. Here, to simplify the description of the transfer, a description has been omitted of transfer paths between the load ports LP and the process modules PM, transfer paths between the process modules PM and the storage ST, and the transfer to the load module LM, the load lock modules LLM and the transfer chamber TC provided in the transfer paths between the storage ST and the load ports LP. In the following description, a description is given by omitting the transfer paths similarly to the above.

As illustrated in FIG. 3, a first wafer W to be transferred (transfer order 1, wafer NO. 101) is carried out of the load port LP1, transferred from the load port LP1 to the process module PM1, and then to the block STA in the storage ST, and temporarily stored therein.

A second wafer W to be transferred (transfer order 2, wafer NO. 201) is carried out of the load port LP2, transferred from the load port LP2 to the process module PM2, and then to the block STB in the storage ST, and temporarily stored therein.

Similarly, third and fourth wafers W to be transferred (transfer order 3 and 4, wafer NOs. 301 and 401) are carried out of the load ports LP3 and LP4, both transferred from the load port LP3 to the process module PM3, and then to the storage ST (block STC), and from the load port LP4 to the process module PM4, and then to the storage ST (block STC), respectively, and temporarily stored in the blocks STC and STD, respectively.

A fifth wafer W to be transferred (transfer order 5, wafer NO. 102) is carried out of the load port LP1 again, transferred from the load port LP1 to the process module PM1, and then to the storage ST (block STA), and temporarily stored therein.

In this manner, the wafers W accommodated in the same FOUPs F loaded on the load ports LP are processed in the same process modules PM, and accommodated in the same block of the storage ST by way of the same routes, respectively. Hence, in the embodiment, the wafer W accommodated in one of the FOUPs F loaded on the load port LP is never processed and stored in the storage ST by being mixed with the wafers W accommodated in the other FOUPs F.

The wafers W temporarily stored in the blocks STA through STD in the storage ST are collected to the load ports LP1 through LP4 at a predetermined timing, and accommodated in the FOUPs F1 through F4, respectively. A description is given below of a collection timing.

When a processed wafer W is collected into the FOUP F in which an unprocessed wafer W is left, the unprocessed wafer W is liable to be corroded by a corrosive gas caused by a reaction of a remaining gas adsorbing on a surface of the processed wafer W with water in the air. Therefore, in the embodiment, the timing when the last unprocessed wafers W carried out of the process modules PM1 through PM4 are carried in the process modules PM1 through PM4, respectively, is made a start timing when the processed wafers W begin to be collected from the storage ST to the load ports LP1 through LP4, respectively. This allows the unprocessed wafer W and the processed wafer W not to be present together in a mixed manner in the same FOUP F loaded on the load port LP.

Here, the collection start timing of each of the wafers W from the storage ST to each of the load ports LP1 through LP4 is not limited to this embodiment, but may be a timing when each of the last unprocessed wafers W is carried out of each of the load ports LP1 through LP4, a timing when each of the last unprocessed wafers W is carried out of each of the process modules PM1 through PM4, or a timing when each of the last unprocessed wafers W is carried in each of the blocks STA through STD of the storage ST after being processed in each of the process modules PM1 through PM4.

[Collection of Wafers]

Moreover, the embodiment adopts a method of sequentially collecting the processed wafers W into any FOUP F, starting the collection of the processed wafers W from the storage ST depending on the timing of processing the last unprocessed wafers W of the FOUP F prior to the other FOUPs F and finishing the collection to the FOUP F in advance (third process). In other words, in the third process, while collecting the processed wafers W in any FOUP, until finishing the collection of the processed wafers W into the FOUP, the processed wafer W is not collected into the other FOUPs loaded on the load ports.

A description is given below of the difference between the method of collecting the wafers W into one of the FOUPs F on a priority basis of the described embodiment and a method of substantially evenly collecting the wafers W into each of the FOUPs F.

Figure 4:
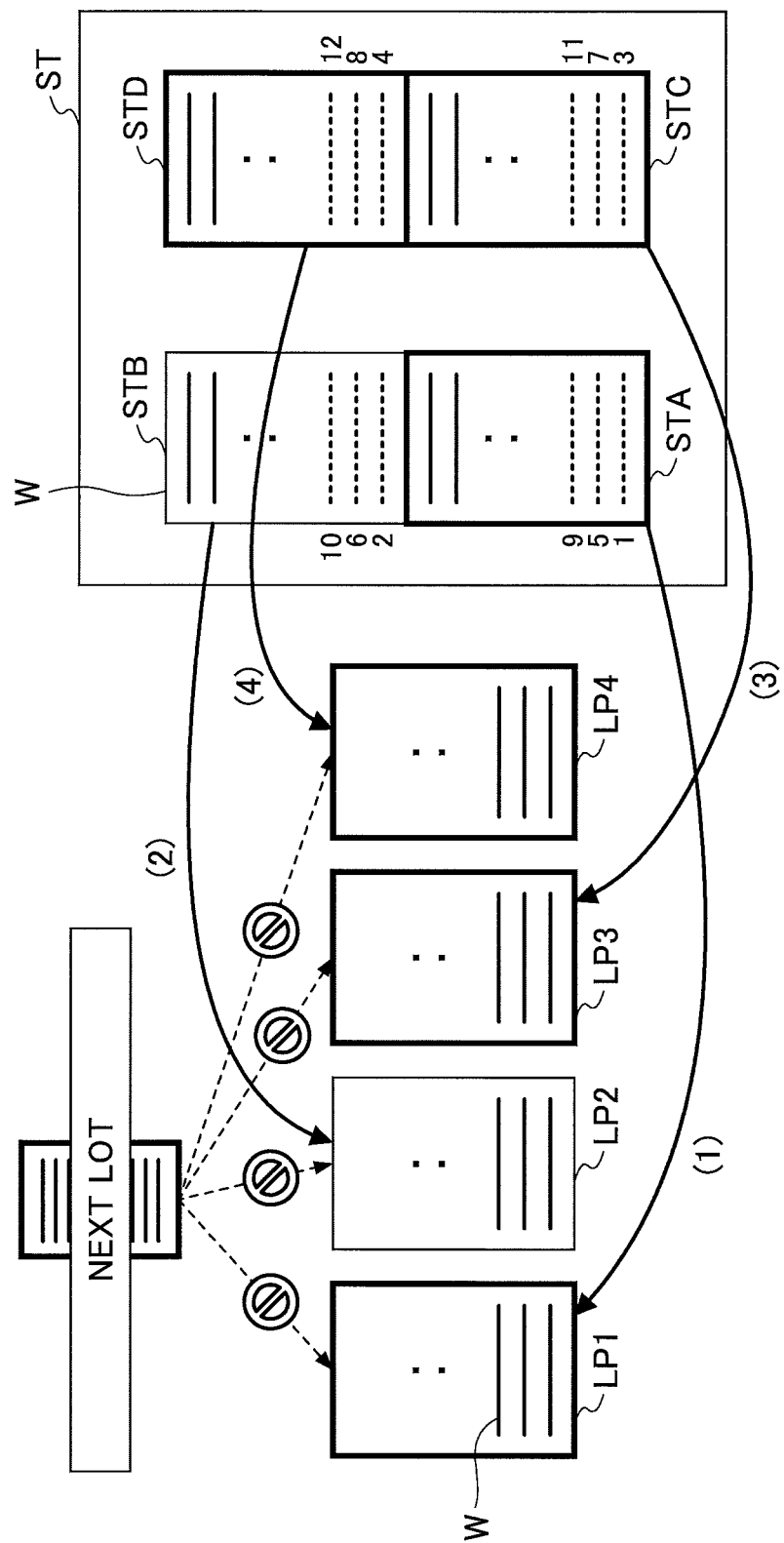
FIG. 4 is a diagram illustrating an example of a transfer route from a storage to a load port.
Figure 5:
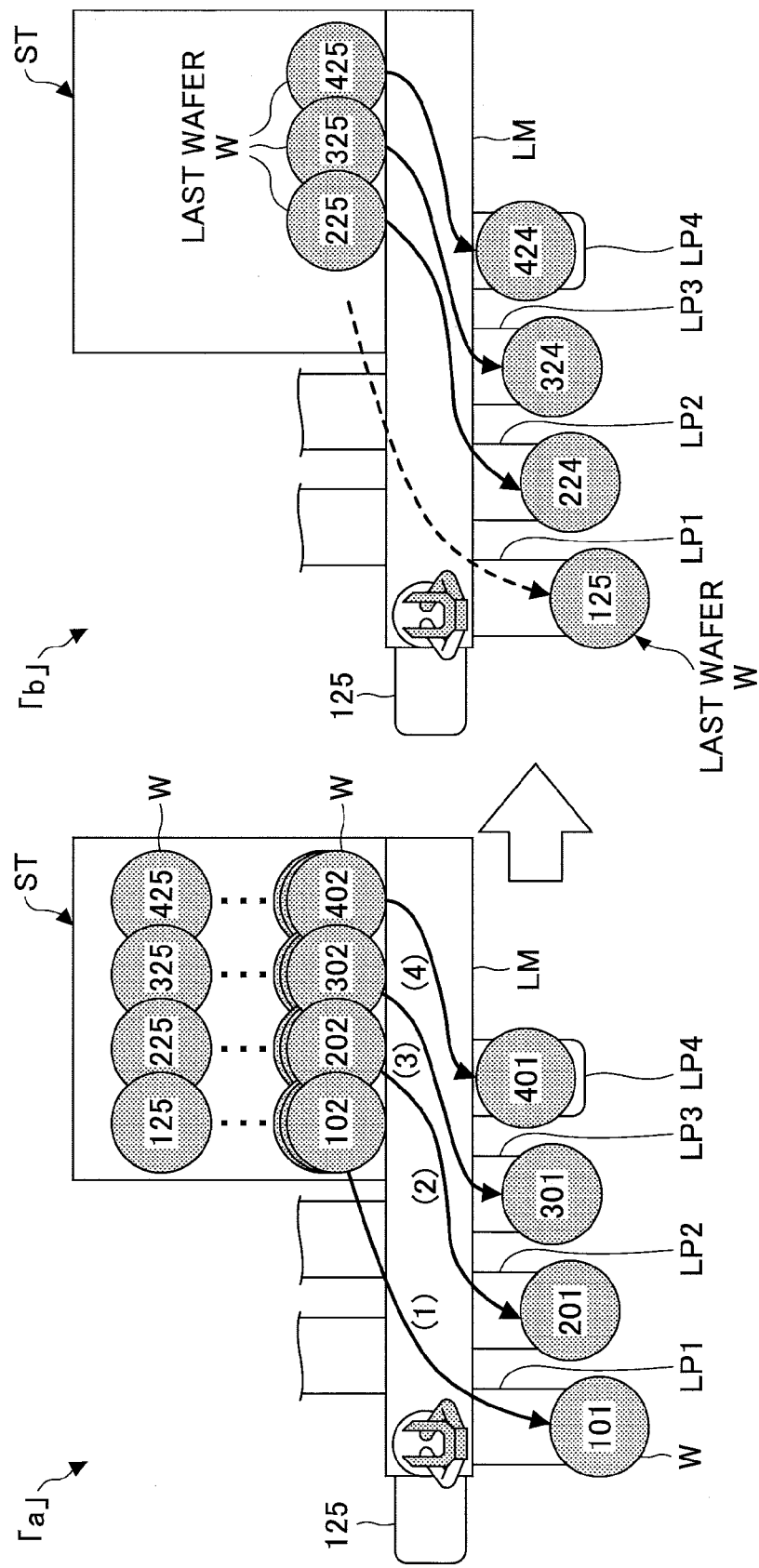
FIG. 5 is an explanation drawing of the example of the transfer route from the storage to the load port.

As discussed above, the carry-out of the unprocessed wafers W starts at approximately the same time at the load ports LP1 through LP4. Hence, the collection of the processed wafers W to the load ports LP1 through LP4 starts at approximately the same time. In this occasion, the collection of the wafers W from each of the boxes STA, STB, STC and STD to each of the load ports LP1, LP2, LP3 and LP4 is performed in the following order as illustrated in FIGS. 4 and 5.

(1) collecting the first wafer 101 of the box STA to the load port LP1
(2) collecting the second wafer 201 of the box STB to the load port LP2
(3) collecting the third wafer 301 of the box STC to the load port LP3
(4) collecting the fourth wafer 401 of the box STD to the load port LP4
(5) collecting the fifth wafer 102 of the box STA to the load port LP1
. . .

As described above, according to the method of substantially evenly collecting the processed wafers W into the load ports LP1 through LP4, the collection to any load ports LP does not finish until all of the processed wafers W are collected into all of the load ports LP. For example, when 25 wafers W are accommodated in each of the FOUPs F1 through F4 loaded on the load ports LP1 through LP4, as illustrated in FIG. 5 "b", after 24 wafers W are collected into each of the load ports LP1 through LP4, which are 96 wafers in total, the $25^{th}$ wafer W (the $97^{th}$ in total) is collected into the load port LP1. At this time, the collection of the wafers W into the FOUP F1 loaded on the load port LP1 finishes; the FOUP F1 can be carried out of the load port LP1; and processing the wafer W can start by carrying the next lot into the load port LP1. Due to this, it takes a long time to start processing the wafers W of the next lot from collecting the wafers W of the present lot. This causes the throughput to be reduced and keeps the process module PM idle for a long time. During the idle time, conditions inside the process modules PM vary, and a dummy process needs to be performed to adjust the conditions inside each of the process modules PM before processing new wafers W, which reduces the productivity.

Figure 6:
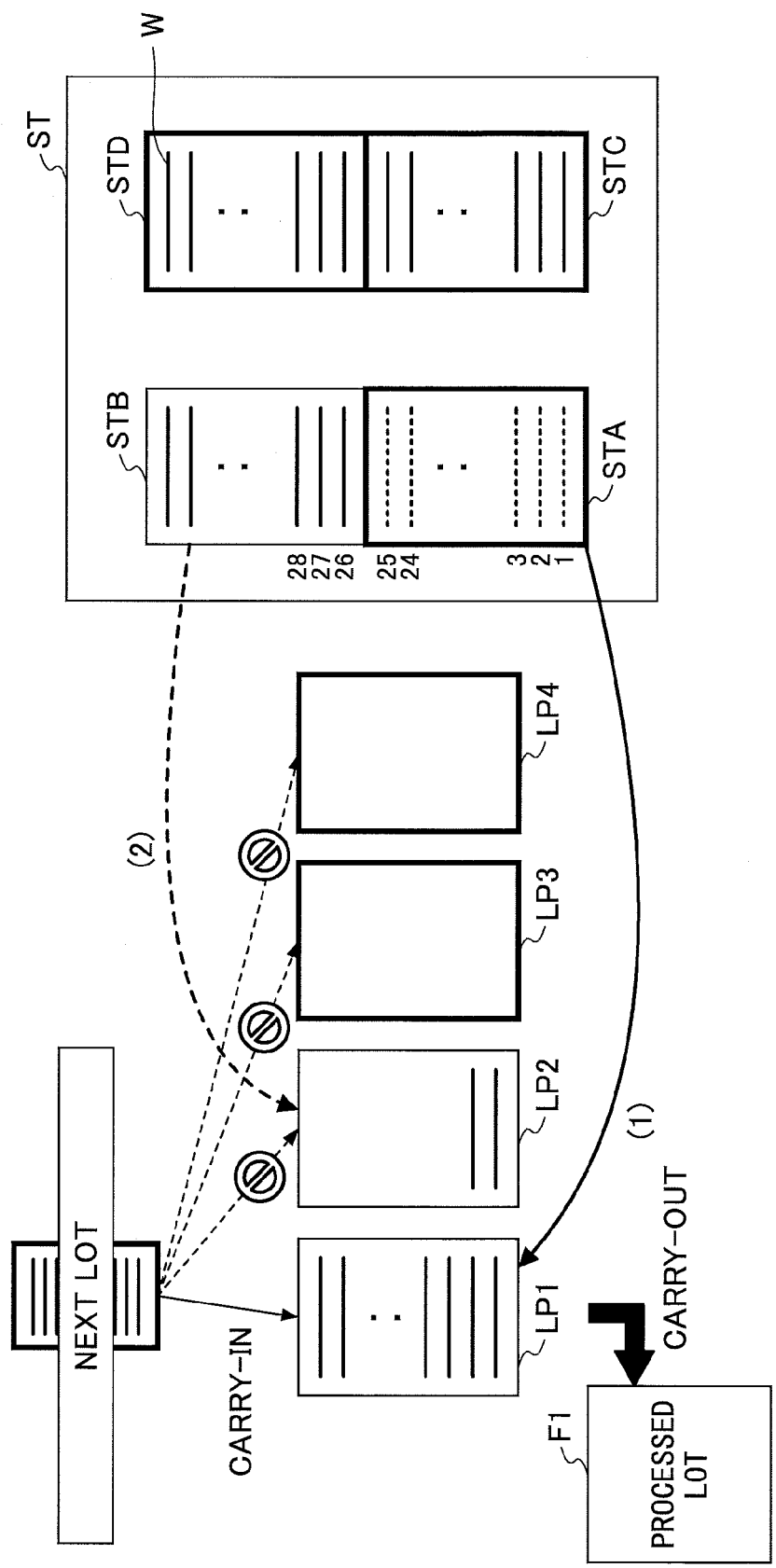
FIG. 6 is a diagram illustrating an example of a transfer route from the storage to the load port according to an embodiment.
Figure 7:
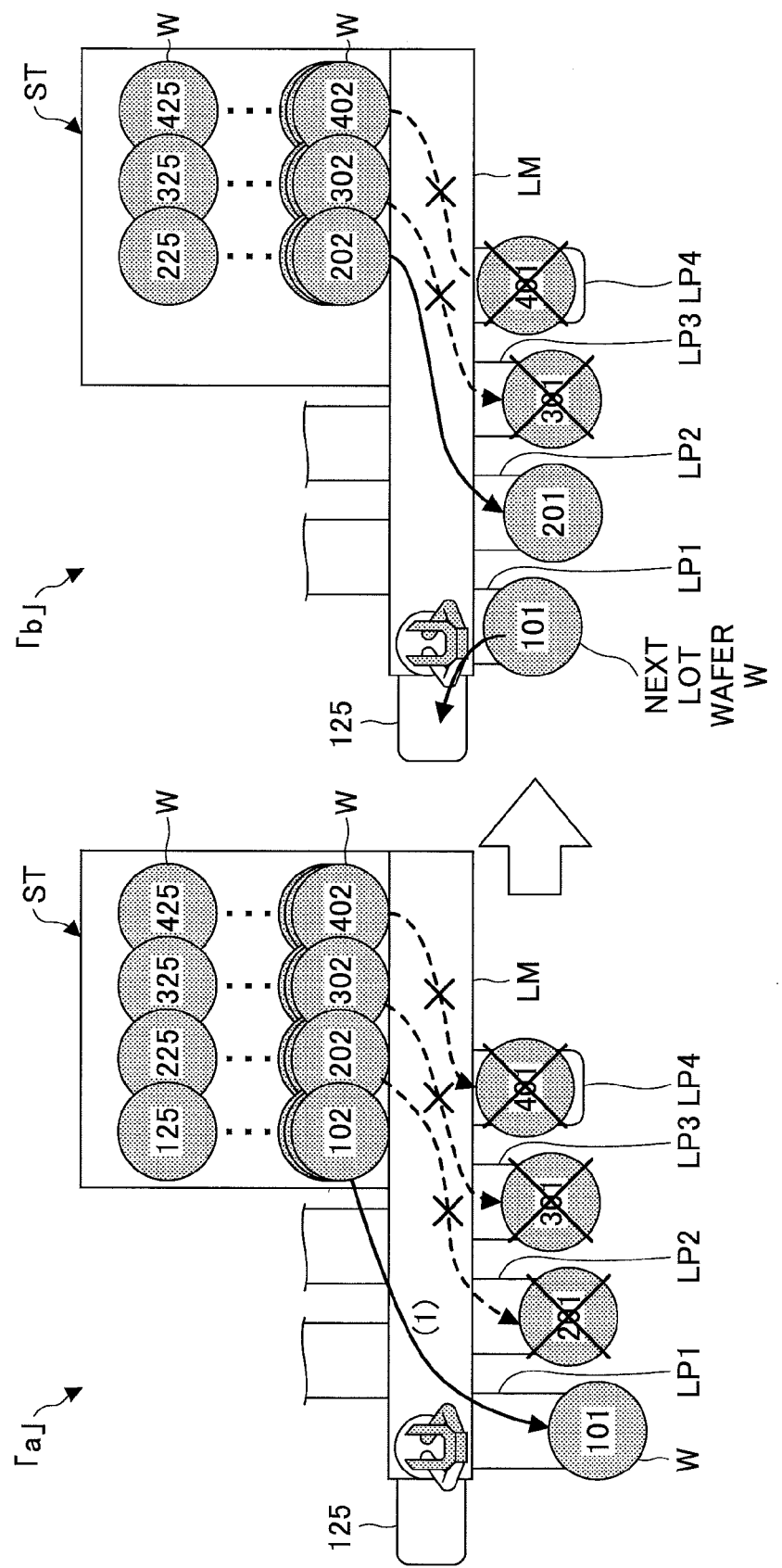
FIG. 7 is an explanation drawing of the example of the transfer route from the storage to the load port according to the embodiment.

In response to this, in the embodiment, the throughput and the productivity can be improved by properly adjusting the method of collecting the processed wafers W. In other words, in the transferring method according to the embodiment, as illustrated in of FIG. 6 and "a" of FIG. 7, the wafers W are collected in the following order.

(1) Wafer Collection into Load Port LP1

The wafer W is collected into the same FOUP F loaded on the load port LP1 in the order of collecting the first wafer 101 of the box STA of the storage ST into the load port LP1, collecting the second wafer 102 of the box STA into the load port LP1, . . . , collecting the $25^{th}$ wafer 125 of the box STA into the load port LP1.

This causes the collection of the wafers W into the FOUP F1 loaded on the load port LP1 to finish. The FOUP F1 having finished the collection is carried out of the load port LP1, and then the next FOUP F5 is carried into the load port LP1. As a result, as illustrated in "b" of FIG. 7, wafers W of the new FOUP F5 (wafers W of the next lot) are processed.

In this manner, after finishing (1) the collection of the wafers W into the FOUP F1 loaded on the load port LP1, (2) the collection of the wafers W into the FOUP F2 loaded on the load port LP2 starts.

(2) Wafer Collection into Load Port LP2

The collection of the wafers W into the FOUP F2 loaded on the load port LP2 is performed prior to the other FOUPs F3 and F4, and then the collection of the wafers W into the other FOUPs F3 and F4 sequentially starts after finishing the collection into the FOUP F2 in the manner of collecting the first wafer 201 of the box STB into the load port LP2, collecting the second wafer 202 of the box STB into the load port LP2, . . . , collecting the $25^{th}$ wafer 225 of the box STB into the load port LP2. More specifically, after finishing (3)

the collection of the wafers W into the load port LP3, the collection of the wafers W into the load port LP4 is further performed. In this way, after finishing the collection into one of the FOUPs F, the collection into the next FOUP F starts.

According to this, to begin with, after finishing the collection of all of the wafers W into the FOUP F1 loaded on the load port LP1, the FOUP F1 is carried out of the load port LP1. This makes it possible to carry the FOUP F1 of the next lot into the load port LP1 and to start processing the wafers W of the next lot without waiting for the collection of the wafers W into the other load ports LP2 through LP4. This enables the throughput and the productivity to be increased. Moreover, this makes it possible to carry the wafers W within the FOUP F1 of the next lot into the process module PM1 and to process the wafers W therein. This causes the idle time of the process module PM to be shortened.

As discussed above, according to the embodiments, the method of collecting the wafers W into each of the load ports LP is changed, and the wafers W are collected in a block unit of the storage in series instead of substantially evenly collecting the wafers W into the plurality of load ports LP. In other words, the processing apparatus 10 is controlled so as to start collecting the wafers W into the other FOUPs F after all of the wafers W accommodated in a certain FOUP F loaded on the load port LP are returned to the FOUP F, and so as not to collect the wafers W into the other FOUPs F while collecting the wafers W into any FOUP F. This allows the FOUP F having finished the collection to be sequentially carried out of the load port LP. As a result, the FOUP F of the next lot can be carried in at an early stage, and the process of the unprocessed wafers W of the next lot can quickly start. For example, when time spent on the collection process of a single wafer W from the storage ST to the load port LP is assumed to be 15 seconds, time can be reduced by 3 (the number of uncollected remaining load ports)×24 (the number of wafers W collected in each of the remaining load ports)×15 seconds (collecting time at one time)=18 minutes until the first FOUP F is carried out of the load port LP compared to the case of evenly collecting the wafers W into each of the load ports LP1 through LP4.

In the embodiment, the wafers W are transferred by corresponding the plurality of load ports LP one-to-one with the plurality of process modules PM. The embodiment has the advantages of not being affected by the mechanical differences among the process modules PM and being unlikely to cause variations in quality within the same lot because all of the wafers W within the same FOUP F loaded on the load port LP are processed under the same conditions. In this case, the process performed in each of the process modules PM may be the same or different.

Here, instead of corresponding the plurality of load ports LP one-to-one with the plurality of process modules PM, the wafers W may be sequentially transferred from the plurality of FOUPs F loaded on the load ports LP to the process module PM capable of processing the wafers W. According to such a transferring method, the throughput and the productivity can be further improved.

Furthermore, in the embodiment, the description has been given in a manner that the carry-out of the unprocessed wafers W starts at each of the load ports LP at approximately the same time, and that the collection of the processed wafers W also starts at each of the load ports LP at approximately the same time. However, the collection timing of the processed wafers W from the storage may be shifted. For example, the collection timing is shifted when the number of the wafers W accommodated in one of the FOUPs F loaded on the load port LP differs from the number of the wafers W accommodated in the other FOUPs F. In addition, the collection timing is shifted when the processing time is not even at each of the process modules PM.

Hereinabove, the description has been given of the processing method and the processing apparatus according to the embodiment of the present invention.

In the processing method and the processing apparatus of the embodiment of the present invention, the timing of processing the last object to be processed in any container may be any of a timing of carrying the last object to be processed out of any container, a timing of carrying the last object to be processed into any process chamber, a timing of carrying the last object to be processed out of any process chamber, or a timing of carrying the last object to be processed into the above-mentioned temporary storage chamber.

In the above-mentioned first process, the object to be processed may be transferred by corresponding the plurality of containers on-to-one with the plurality of the process chambers.

In the above-mentioned first process, the object to be processed may be transferred from the plurality of containers to the process chamber capable of processing the object to be processed.

In the above-mentioned third process, the processed object to be processed may not be collected into the other containers while collecting the processed object to be processed into any container.

As discussed above, although the embodiments of the processing method and the processing apparatus have been described, the present invention is not limited to the above embodiments, but various modifications and alternations can be made without departing from the scope of the present invention. Moreover, when the plurality of embodiments and a plurality of modifications are provided, any of the embodiments and the modifications can be combined with each other as far as the combination does not cause any contradiction.

For example, the process performed in the process modules PM (process chamber) may be a plasma process or other than the plasma process. When the plasma process is performed, a plasma generation unit can adopt a capacitively coupled plasma (CCP: Capacitively Coupled Plasma) generation unit, an inductively coupled plasma (ICP: Inductively Coupled Plasma) generation unit, a helicon wave excited plasma (HWP: Helicon Wave Plasma) generation unit, a microwave excited surface wave plasma generation unit including microwave plasma generated from a radial line slot antenna or SPA (Slot Plane Antenna) plasma, an electron cyclotron resonance (ECR: Electron Cyclotron Resonance Plasma) plasma generation unit, and a remote plasma generation unit using the above generation units.

A substrate to be processed in the substrate processing apparatus of the present invention is not limited to the (semiconductor) wafer used in the description of the embodiments, but for example, may be a large substrate for a flat panel display, a substrate for an EL (electroluminescence) device or a solar cell.

The present application is based on and claims the benefit of priority of Japanese Patent Application No. 2012-245821 filed on Nov. 7, 2012, and U.S. Provisional Application No. 61/727,199 filed on Nov. 16, 2012, the entire contents of which are herein incorporated by reference.

DESCRIPTION OF THE REFERENCE NUMERALS

10 processing apparatus
125 alignment mechanism

EC apparatus computer
MC machine computer
F1 through F4 FOUP
LP1 through LP4 load port
LM load module
PM1 through PM4 process module
ST storage
TC transfer chamber
LLM load lock module

The invention claimed is:

1. A method of processing an object to be processed by using a processing apparatus, the processing apparatus including,
a plurality of containers to contain the object and provided in a load port;
a plurality of process chambers configured to perform a desired process on the object therein;
a temporary storage chamber to temporarily store the object therein, the temporary storage chamber being divided into a plurality of blocks corresponding to the plurality of process chambers on a one-to-one basis; and
a transfer device configured to transfer the object,
the method comprising steps of:
transferring an unprocessed object from the plurality of containers to the plurality of process chambers;
transferring a processed object from the plurality of process chambers to the plurality of blocks of the temporary storage chamber corresponding to the plurality of process chambers, respectively, in parallel with each other; and
detecting that a last unprocessed object is transferred from a first one of the plurality of containers, the first one of the containers being placed at a first position in the load port;
starting a collection of the processed object from a first one of the blocks of the temporary storage chamber to the first one of the plurality of containers upon detecting that the last unprocessed object is removed from the first one of the plurality of containers; and
continuing the collection of the processed object from the first one of the blocks of the temporary chamber to the first one of the plurality of containers prior to collecting the processed object into the other containers from the other of the blocks of the temporary storage chamber until finishing the collection of the processed object from the first one of the blocks of the temporary storage chamber into the first one of the plurality of containers;
unloading the first one of the plurality of containers from the load port;
loading a new container containing a new unprocessed object onto the first position in the load port;
detecting that a last unprocessed object is transferred from a second one of the plurality of containers, the second one of the containers being placed at a second position in the load port;
starting a collection of the processed object from a second one of the blocks of the temporary storage chamber to the second one of the plurality of containers upon detecting that the last unprocessed object is removed from the second one of the plurality of containers; and
starting a transfer of the new unprocessed object from the new container to the plurality of process chambers before finishing the collection of the processed object from the second one of the blocks of the temporary storage chamber into the second one of the plurality of containers.

2. The method as claimed in claim 1, wherein the timing of processing the last object of the one of the plurality of containers is any of a timing of carrying the last object out of the one of the plurality of containers, a timing of carrying the last object into one of the plurality of process chambers, or a timing of carrying the last object into the temporary storage chamber.

3. The method as claimed in claim 1, wherein the unprocessed object is transferred by corresponding the plurality of containers one-to-one with the plurality of process chambers in the step of transferring the unprocessed object.

4. The method as claimed in claim 1, wherein the unprocessed object is transferred from the plurality of containers to the plurality of process chambers capable of processing the unprocessed object in the step of transferring the unprocessed object.

5. The method as claimed in claim 1, wherein the processed object is not collected into the other containers while collecting the processed object into the one of the plurality of containers in the step of collecting the processed object into the one of the plurality of containers.

6. A processing apparatus comprising:
a plurality of containers to contain an object to be processed;
a plurality of process chambers configured to perform a desired process on the object therein;
a plurality of load ports to receive the plurality of containers thereon, each of the load ports corresponding to the plurality of process chambers on a one-to-one basis;
a temporary storage chamber to temporarily store the object, the temporary storage chamber being divided into a plurality of blocks corresponding to the plurality of process chambers on a one-to-one basis, the plurality of process chambers, the plurality of load ports and the plurality of blocks of the temporary storage chamber being the same in number;
a transfer device configured to transfer the object; and
a control unit configured to control the plurality of containers, the plurality of process chambers and the transfer device so as to transfer an unprocessed object from the plurality of containers to the plurality of process chambers, to transfer a processed object from the plurality of process chambers to the plurality of blocks of the temporary storage chamber, to load the plurality of containers in the plurality of load ports, and to unload the plurality of containers from the plurality of load ports,
wherein the control unit detects that a last unprocessed object is transferred from a first one of the plurality of containers, the first one of the containers being placed on a first load port, and then starts a collection of the processed object from a first one of the plurality of blocks of the temporary storage chamber to the first one of the plurality of containers from which the last unprocessed object is removed, and continues the collection of the processed object from the first one of the blocks of the temporary chamber to the first one of the plurality of containers prior to collecting the processed object into the other containers from the other of the plurality of blocks of the temporary storage chamber until finishing the collection of the processed object into the first one of the plurality of containers, and
wherein the control unit unloads the first one of the plurality of containers from the first load port, loads a new container containing a new unprocessed object onto a second load port, detects that a last unprocessed object is transferred from a second one of the plurality of containers, starts a collection of the processed object from a second one of the blocks of the temporary storage chamber to the second one of the plurality of containers upon detecting that the last unprocessed object is removed from the second one of the plurality of containers, and starts a transfer of the new unprocessed object from the new container to the plurality of process chambers before finishing the collection of the processed object from the second one of the blocks of the temporary storage chamber into the second one of the plurality of containers.

* * * * *